(12) United States Patent
Liao et al.

(10) Patent No.: US 8,716,750 B2
(45) Date of Patent: May 6, 2014

(54) SEMICONDUCTOR DEVICE HAVING EPITAXIAL STRUCTURES

(75) Inventors: Chin-I Liao, Tainan (TW); Teng-Chun Hsuan, Tainan (TW); I-Ming Lai, Kaohsiung (TW); Chin-Cheng Chien, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 45 days.

(21) Appl. No.: 13/189,570

(22) Filed: Jul. 25, 2011

(65) Prior Publication Data

US 2013/0026538 A1 Jan. 31, 2013

(51) Int. Cl.
 *H01L 29/66* (2006.01)
 *H01L 29/165* (2006.01)
 *H01L 29/78* (2006.01)

(52) U.S. Cl.
 CPC .......... *H01L 29/165* (2013.01); *H01L 29/7848* (2013.01)
 USPC ............. 257/190; 257/E29.266; 257/E29.085

(58) Field of Classification Search
 CPC .............. H01L 29/165; H01L 29/7848; H01L 29/7378; H01L 2924/10271; H01L 31/035254
 USPC ........................... 257/190, E21.092; 438/300
 See application file for complete search history.

(56) References Cited

U.S. PATENT DOCUMENTS

| | | | |
|---|---|---|---|
| 4,891,303 A | 1/1990 | Garza | |
| 5,217,910 A | 6/1993 | Shimizu | |
| 5,273,930 A | 12/1993 | Steele | |
| 5,356,830 A | 10/1994 | Yoshikawa | |
| 5,372,957 A | 12/1994 | Liang | |
| 5,385,630 A | 1/1995 | Philipossian | |
| 5,399,506 A | 3/1995 | Tsukamoto | |
| 5,625,217 A | 4/1997 | Chau | |
| 5,777,364 A | 7/1998 | Crabbe | |
| 5,783,478 A | 7/1998 | Chau | |
| 5,783,479 A | 7/1998 | Lin | |
| 5,960,322 A | 9/1999 | Xiang | |
| 6,030,874 A | 2/2000 | Grider | |
| 6,048,756 A | 4/2000 | Lee | |
| 6,074,954 A | 6/2000 | Lill | |
| 6,100,171 A | 8/2000 | Ishida | |
| 6,110,787 A | 8/2000 | Chan | |
| 6,165,826 A | 12/2000 | Chau | |
| 6,165,881 A | 12/2000 | Tao | |
| 6,191,052 B1 | 2/2001 | Wang | |
| 6,228,730 B1 | 5/2001 | Chen | |
| 6,274,447 B1 | 8/2001 | Takasou | |
| 6,355,533 B2 | 3/2002 | Lee | |
| 6,365,476 B1 | 4/2002 | Talwar | |

(Continued)

*Primary Examiner* — Thao Le
*Assistant Examiner* — Laura Dykes
(74) *Attorney, Agent, or Firm* — Winston Hsu; Scott Margo

(57) ABSTRACT

A semiconductor device having epitaxial structures includes a gate structure positioned on a substrate, epitaxial structures formed in the substrate at two sides of the gate structure, and an undoped cap layer formed on the epitaxial structures. The epitaxial structures include a dopant, a first semiconductor material having a first lattice constant, and a second semiconductor material having a second lattice constant, and the second lattice constant is larger than the first lattice constant. The undoped cap layer also includes the first semiconductor material and the second semiconductor material. The second semiconductor material in the epitaxial structures includes a first concentration, the second semiconductor material in the undoped cap layer includes at least a first concentration, and the second concentration is lower than the first concentration.

19 Claims, 3 Drawing Sheets

(56) References Cited

U.S. PATENT DOCUMENTS

| | | |
|---|---|---|
| 6,368,926 B1 | 4/2002 | Wu |
| 6,444,591 B1 | 9/2002 | Schuegraf |
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,132,338 B2 | 11/2006 | Samoilov |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,288,822 B1 | 10/2007 | Ting |
| 7,303,999 B1 | 12/2007 | Sriraman |
| 7,335,959 B2 | 2/2008 | Curello |
| 7,410,859 B1 | 8/2008 | Peidous |
| 7,462,239 B2 | 12/2008 | Brabant |
| 7,491,615 B2 | 2/2009 | Wu |
| 7,494,856 B2 | 2/2009 | Zhang |
| 7,494,858 B2 | 2/2009 | Bohr |
| 7,592,231 B2 | 9/2009 | Cheng |
| 7,612,389 B2 | 11/2009 | Lin et al. |
| 7,667,227 B2 | 2/2010 | Shimamune |
| 7,691,752 B2 | 4/2010 | Ranade |
| 7,838,370 B2 | 11/2010 | Mehta |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0163558 A1 | 7/2006 | Lee |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0128783 A1 | 6/2007 | Ting |
| 2007/0166929 A1 | 7/2007 | Matsumoto |
| 2007/0262396 A1 | 11/2007 | Zhu |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0220579 A1 | 9/2008 | Pal |
| 2008/0233722 A1 | 9/2008 | Liao |
| 2008/0233746 A1 | 9/2008 | Huang |
| 2009/0039389 A1 | 2/2009 | Tseng |
| 2009/0045456 A1 | 2/2009 | Chen |
| 2009/0095992 A1 | 4/2009 | Sanuki |
| 2009/0108308 A1* | 4/2009 | Yang et al. ............ 257/288 |
| 2009/0117715 A1 | 5/2009 | Fukuda |
| 2009/0124056 A1 | 5/2009 | Chen |
| 2009/0166625 A1 | 7/2009 | Ting |
| 2009/0184402 A1 | 7/2009 | Chen |
| 2009/0186475 A1 | 7/2009 | Ting |
| 2009/0239347 A1 | 9/2009 | Ting et al. |
| 2009/0246922 A1 | 10/2009 | Wu |
| 2009/0278170 A1 | 11/2009 | Yang |
| 2009/0302348 A1 | 12/2009 | Adam |
| 2010/0001317 A1 | 1/2010 | Chen |
| 2010/0015774 A1* | 1/2010 | Shimamune et al. ...... 438/300 |
| 2010/0093147 A1* | 4/2010 | Liao et al. .............. 438/300 |

\* cited by examiner

SEMICONDUCTOR DEVICE HAVING EPITAXIAL STRUCTURES

BACKGROUND OF THE INVENTION

1. Field of the Invention

The present invention relates to a semiconductor device having epitaxial structures, and more particularly, to a semiconductor device having an epitaxial source/drain.

2. Description of the Prior Art

Epitaxial structures are used in a wide variety of semiconductor applications. For example, the prior art usually forms an epitaxial layer such as a silicon germanium (hereinafter abbreviated as SiGe) layer in a single crystal substrate by performing a selective epitaxial growth (hereinafter abbreviated as SEG) method. Since the epitaxial layer has the crystalline orientation almost identical to the crystalline orientation of the substrate, the epitaxial layers serves as a raised source/drain or a recessed source/drain for the semiconductor device. Because the lattice constant of the epitaxial SiGe layer is larger than that of the silicon substrate, a strain stress is generated to the channel region of the meta-oxide semiconductor (MOS) transistor device. Accordingly, carrier mobility in the channel region is improved and the speed of the MOS transistor is increased.

Although the epitaxial SiGe layer efficiently improves device performance, it increases complexity of the semiconductor fabrication and difficulties of the process control. For example, it is well-known that the stress is increased when the germanium concentration in the SiGe epitaxial structures is increased. However, the germanium concentration cannot be increased as expected: If the thickness of the epitaxial SiGe structure exceeds the critical thickness, it is relaxed and fails to cause stress to the channel region. Except the thickness issue, it is often found that agglomeration is formed by metal and germanium during the silicide process and causes serious junction leakage. Furthermore, the prior art also observes that because the lattice constants in the interface between the SiGe epitaxial structures and the silicon substrate are so different that the threshold voltage (hereinafter abbreviated as Vt) roll-off occurs.

Accordingly, though the epitaxial structure is able to improve the device performance, it is always in need to improve the epitaxial structure itself.

SUMMARY OF THE INVENTION

According to an aspect of the present invention, a semiconductor device having epitaxial structures is provided. The semiconductor device includes a gate structure positioned on a substrate, epitaxial structures formed in the substrate at two sides of the gate structure, and an undoped cap layer formed on the epitaxial structures. The epitaxial structure includes a dopant, a first semiconductor material having a first lattice constant, and a second semiconductor material having a second lattice constant. The second lattice constant is larger than the first lattice constant. The undoped cap layer includes the first semiconductor material and the second semiconductor material. The second semiconductor material in the epitaxial structures has a first concentration, the second semiconductor material in the undoped cap layer has a second concentration, and the second concentration is lower than the first concentration.

According to another aspect of the present invention, a semiconductor device having epitaxial structures is provided. The semiconductor device includes a gate structure positioned on a substrate, a pair of recesses formed in the substrate respectively at two sides of the gate structure, epitaxial structures respectively formed in recesses at the two sides of the gate structure, and an undoped under layer formed in the recesses and in between the epitaxial structure and the substrate. The epitaxial structures include a first semiconductor material having a first lattice constant and a second semiconductor material having a second lattice constant. The second lattice constant is larger than the first lattice constant. The undoped under layer covers sidewalls and a bottom of the recess and has the first semiconductor material and the second semiconductor material. The second semiconductor material in the epitaxial structures has a first concentration, the second semiconductor material in the undoped under layer has a second concentration, and the second concentration is lower than the first concentration.

According to the semiconductor device having epitaxial structures provided by the present invention, the epitaxial structures serving as the source/drain of the semiconductor device includes the undoped cap layer with lower Ge concentration formed on the surface of the epitaxial structures, therefore the agglomeration formed by the metal and Ge in the silicide process and the junction leakage are both prevented. Furthermore, the semiconductor device having epitaxial structures provided by the present invention also includes the undoped under layer with lower Ge concentration formed in the recess and in between the epitaxial structure and the substrate, therefore the Vt roll-off issue, which is caused by the lattice constant difference between the SiGe epitaxial structure and the silicon substrate, is mitigated.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
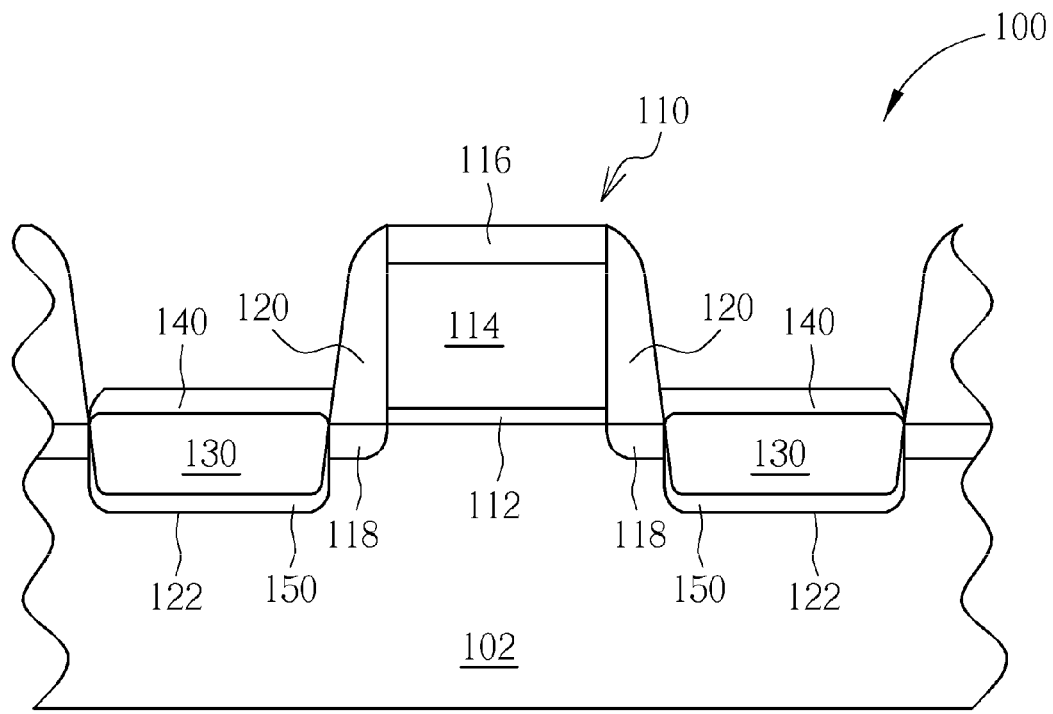
FIG. 1 is a schematic drawing illustrating a semiconductor device having epitaxial structures provided by a first preferred embodiment of the present invention.

Please refer to FIG. 1, which is a schematic drawing illustrating a semiconductor device having epitaxial structures provided by a first preferred embodiment of the present invention. As shown in FIG. 1, a semiconductor device 100 having epitaxial structures provided by the preferred embodiment includes a substrate 102 and a gate structure 110 formed on the substrate 102. The gate structure 110 includes a gate insulating layer 112, and the gate insulating layer 112 can include high dielectric constant (high-k) material or silicon oxide. The gate structure 110 also includes a gate electrode 114 defined by a patterned hard mask 116. The gate electrode 114 can include metal or polysilicon. The semiconductor device 100 also includes lightly-doped drains (LDDs) 118 formed in the substrate 102 at two sides of the gate structure 110, a spacer 120 formed on sidewalls of the gate structure 110, and a pair of recesses 122 formed in the substrate 102 respectively at the two sides of the gate structure 110, particularly at two sides of the spacer 120.

Please still refer to FIG. 1. After performing a cleaning process to remove native oxides or other contaminants from the substrate 102, a SEG method is performed to form an epitaxial structure 130 respectively in the recess 122. In other words, the semiconductor device 100 provided by the preferred embodiment also includes epitaxial structures 130 positioned in the substrate 102 respectively at the two sides of the gate structure 110, particularly in the recess 122 at the two sides of gate structure 110. The epitaxial structure 130 includes a first semiconductor material and a second semiconductor material. The first semiconductor material has a first lattice constant while the second semiconductor material has a second lattice constant, and the second lattice constant is larger than the first lattice constant. In the preferred embodiment, the first semiconductor material includes Si and the second semiconductor material includes Ge. That means the epitaxial structure 130 includes SiGe, but not limited to this. In addition, a concentration of the second semiconductor material, that is the Ge concentration, is exemplarily but not limited to about 36% in the preferred embodiment. Because the lattice constant of SiGe is larger than that of the substrate, the epitaxial SiGe structure serves as a strained-silicon structure and causes changes to band structure. Therefore the carrier mobility in the channel region is increased and the performance of the semiconductor device 100 is consequently improved. As shown in FIG. 1, a surface of the epitaxial structures 130 and a surface of the substrate 102 are not coplanar. In detail, the surface of the epitaxial structure 130 is higher than the surface of the substrate 102.

Furthermore, ion implantation can be performed before or after forming the epitaxial structures 130, or during forming the epitaxial structures 130. Thus dopants required by different conductivity types of the semiconductor device 100 are implanted into the epitaxial structures 130. Accordingly, the implanted epitaxial structures 130 include the required p-type or n-type dopant and serve as a source/drain of the semiconductor device 100. Because the ion implantation and choices of the dopant are well-known to those skilled in the art, the details are omitted herein in the interest of brevity.

As mentioned above, to prevent the epitaxial structure 130 from agglomeration formed by metals and Ge in the silicide process, a cap layer can be formed on the surface of the epitaxial structure 130. For example, a pure silicon cap layer (not shown) can be formed on the epitaxial structures 130 for serving as a reacting subject in the silicide process. However, since the Ge concentration in the pure silicon cap layer is 0%, which is distinctly different from the Ge concentration in the epitaxial structures 130 (36%), it is found that the pure silicon cap layer obtains a wavy surface. In detail, an atomic force microscope (hereinafter abbreviated as AFM) measured root mean square (hereinafter abbreviated as RMS) roughness of the pure silicon cap layer is about 4.21 nanometer (hereinafter abbreviated as nm). This wavy/rough surface renders adverse impact to the following processes, even to the strain stress provided by the epitaxial structures 130.

It is therefore assumed that the undesirable agglomeration problem occurs when the epitaxial structures 130 is provided without the pure silicon cap layer, however the epitaxial structures 130 with the pure silicon cap layer having Ge concentration distinctly different from the Ge concentration in the epitaxial structures 130 results in the wavy surface. As a countermeasure against to the dilemmatic problem, the preferred embodiment provides a not pure silicon undoped cap layer 140 formed on the epitaxial structures 130. The undoped cap layer 140 includes the first semiconductor material and the second semiconductor material as mentioned above, that is SiGe. According to the preferred embodiment, the undoped cap layer 140 is a single layer as shown in FIG. 1. A concentration of the second semiconductor material in the undoped cap layer 140, that is the Ge concentration, is lower than the Ge concentration in the epitaxial structures 130, and is exemplarily about 25%. In addition, a thickness of the undoped cap layer 140 is, exemplarily but not limited to, 150 angstroms (Å) in the preferred embodiment.

In addition, the semiconductor device 100 provided by the preferred embodiment can further include an undoped under layer 150 positioned in the recess 122 and in between the epitaxial structure 130 and the substrate 102. The undoped under layer 150 covers sidewalls and a bottom of the recess 122. The undoped under layer 150 can be a single layer or multi-layer and includes the abovementioned first semiconductor material and second semiconductor material. That means the undoped under layer 150 include SiGe. The second semiconductor material in the undoped under layer 150 has a concentration lower than the Ge concentration in the epitaxial structures 130, and is between 10% and 25%. More important, the concentration of the second semiconductor material in the undoped under layer 150 is upwardly increased. It is noteworthy that details about the undoped under layer 150 will be described in the following preferred embodiments, therefore those details are omitted herein for simplicity.

According to the semiconductor device 100 having epitaxial structures provided by the first preferred embodiment, the not pure silicon undoped cap layer 140 is formed on the surface of the epitaxial structures 130. The undoped cap layer 140 includes SiGe and the Ge concentration is preferably about 25%. Since the Ge concentration in the undoped cap layer 140 is about 25% and the Ge concentration in the epitaxial structures 130 is about 36%, the difference between the two Ge concentrations are much less. Consequently, the undoped cap layer 140 formed on the surface of the epitaxial structures 130 obtains a smooth surface, and an AFM measured RMS roughness of the undoped cap layer 140 is about 0.75 nm. Compared with the RMS roughness of the pure silicon cap layer, that is 4.21 nm, it is concluded that the surface roughness is substantially improved. Furthermore, since the Ge concentration in the undoped cap layer 140 is lower, the agglomeration problem in the silicide process is mitigated.

Figure 2:
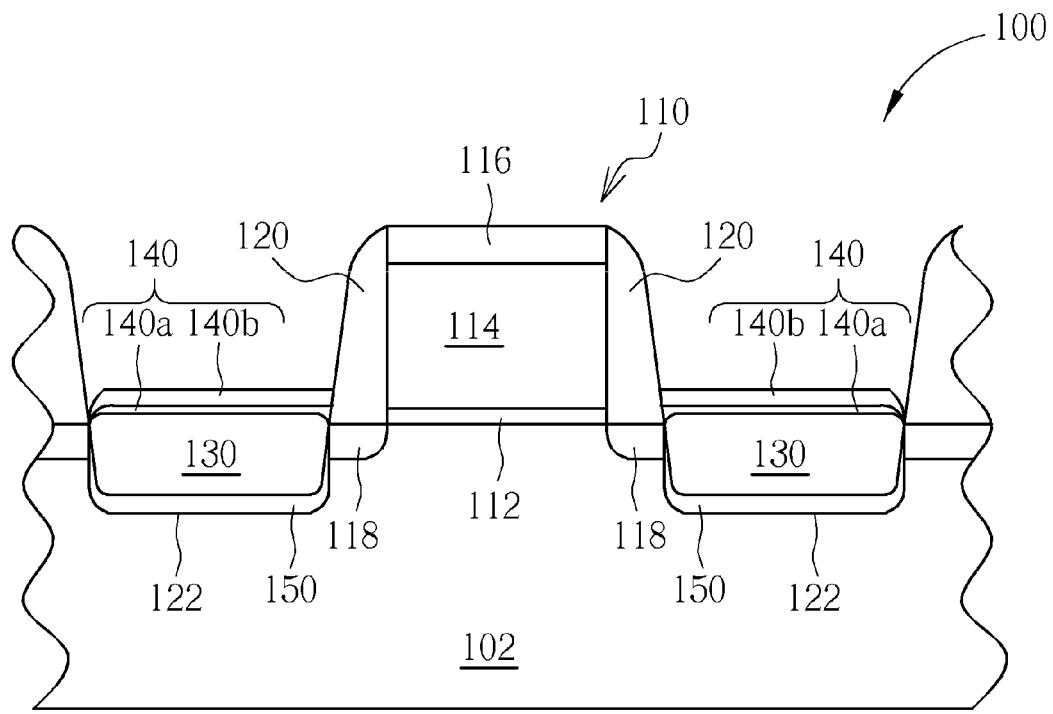
FIG. 2 is a schematic drawing illustrating a semiconductor device having epitaxial structures provided by a second preferred embodiment of the present invention.

Please refer to FIG. 2, which is a schematic drawing illustrating a semiconductor device having epitaxial structures provided by a second preferred embodiment of the present invention. It is noteworthy that elements the same in the first and second preferred embodiments are depicted by the same numerals. As shown in FIG. 2, a semiconductor device 100 having epitaxial structures provided by the preferred embodiment includes a substrate 102 and a gate structure 110 formed on the substrate 102. The gate structure 110 includes a gate insulating layer 112, and the gate insulating layer 112 can include high-k material or silicon oxide. The gate structure 110 also includes a gate electrode 114 defined by a patterned hard mask 116. The gate electrode 114 can include metal or polysilicon. The semiconductor device 100 also includes LDDs 118 formed in the substrate 102 at two sides of the gate structure 110, a spacer 120 formed on sidewalls of the gate structure 110, and a pair of recesses 122 formed in the substrate 102 respectively at the two sides of the gate structure 110, particularly at two sides of the spacer 120.

Please still refer to FIG. 2. The semiconductor device 100 provided by the preferred embodiment also includes epitaxial structures 130 positioned in the substrate 102 respectively at the two sides of the gate structure 110, particularly in the recess 122 at the two sides of gate structure 110. The epitaxial structure 130 includes a first semiconductor material and a second semiconductor material. The first semiconductor material has a first lattice constant while the second semiconductor material has a second lattice constant, and the second lattice constant is larger than the first lattice constant. In the preferred embodiment, the first semiconductor material includes Si and the second semiconductor material includes Ge. That means the epitaxial structure 130 includes SiGe, but not limited to this. In addition, a concentration of the second semiconductor material, that is the Ge concentration, is exemplarily but not limited to, about 36% in the preferred embodiment. As shown in FIG. 2, a surface of the epitaxial structures 130 is higher than a surface of the substrate 102.

As mentioned above, to solve the dilemmatic problem, the preferred embodiment provides an undoped cap layer 140 formed on the epitaxial structures 130. It is noteworthy that the undoped cap layer 140 provided by the preferred embodiment includes at least a first single layer 140a and a second single layer 140b as shown in FIG. 2, and the first single layer 140a is formed between the second single layer 140b and the epitaxial structure 130. The undoped cap layer 140 (including the first single layer 140a and the second single layer 140b) includes the first semiconductor material and the second semiconductor material as mentioned above, that is SiGe. According to the preferred embodiment, Ge in the first single layer 140a has a first concentration, Ge in the second single layer 140b has a second concentration, the first concentration and the second concentration are all lower than the Ge concentration in the epitaxial structures 130, and the second concentration is lower than the first concentration. In the preferred embodiment, the first concentration is preferably about 25% and the second concentration is preferably about 0%. In other words, the second preferred embodiment provides a multilayered cap layer 140 having Ge concentration upwardly decreased. In addition, a thickness of the undoped cap layer 140 is, exemplarily but not limited to, 150 Å in the preferred embodiment. It is also noteworthy that a thickness of the first single layer 140a and a thickness of the second single layer 140b have a ratio, and the ratio is about 1:2 according to the preferred embodiment.

As mentioned above, the semiconductor device 100 provided by the preferred embodiment can also include an undoped under layer 150. Since details about the undoped under layer 150 will be described in the following preferred embodiments, therefore those details are omitted herein for simplicity.

According to the semiconductor device 100 having epitaxial structures provided by the second preferred embodiment, the multilayered cap layer 140 is formed on the surface of the epitaxial structures 130. The multilayered cap layer 140 includes the first single layer 140a and the second single layer 140b. Both the first single layer 140a and the second single layer 140b include SiGe and the Ge concentration in the first single layer 140a is preferably about 25% while the Ge concentration in the second single layer 140b is preferably about 0%. In addition, a thickness of the second single layer 140b is larger than a thickness of the first single layer 140a. That means the multilayered cap layer 140 has the Ge concentration upwardly decreased. Since the first single layer 140a (Ge concentration of about 25%) is form between the second single layer 140b (Ge concentration of about 0%) and the epitaxial structure 130 (Ge concentration of about 36%), the first single layer 140a serves as a buffer layer between the second single layer 140b and the epitaxial structure 130. Consequently, the multilayered cap layer 140 formed on the surface of the epitaxial structures 130 obtains a smoother surface, and an AFM measured RMS roughness of the multilayered cap layer 140 is about 0.76 nm. Compared with the RMS roughness of the pure silicon cap layer, that is 4.21 nm, it is concluded that the surface roughness is substantially improved. Furthermore, since the Ge concentration of the second single layer 140b in the multilayered cap layer 140 is 0%, the second single layer 140b serves as the reacting subject in the silicide process. Thus the agglomeration problem in the silicide process is prevented.

Figure 3:
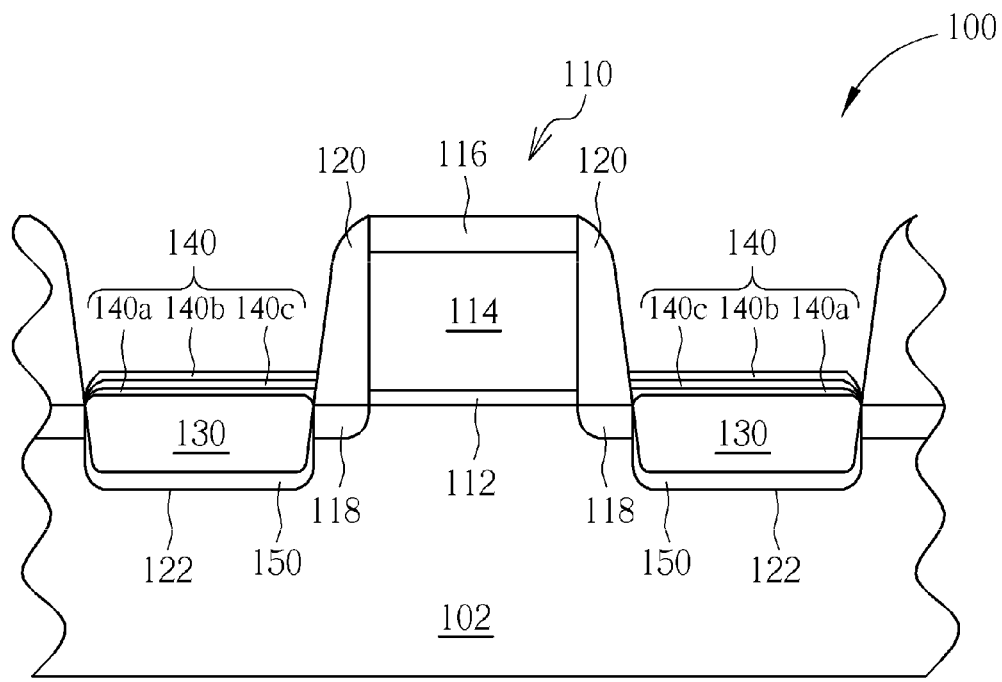
FIG. 3 is a schematic drawing illustrating a semiconductor device having epitaxial structures provided by a third preferred embodiment of the present invention.

Please refer to FIG. 3, which is a schematic drawing illustrating a semiconductor device having epitaxial structures provided by a third preferred embodiment of the present invention. It is noteworthy that elements the same in the first and third preferred embodiments such as the substrate 102, the gate structure 110, the LDDs 118, the spacer 120, the recesses 122, and the epitaxial structures 130 formed in the recesses 122 are depicted by the same numerals, and those details are omitted herein for simplicity. Please still refer to FIG. 3. The semiconductor device 100 provided by the preferred embodiment also includes the SiGe epitaxial structures 130, and the concentration of the second semiconductor material, that is the Ge concentration, is exemplarily but not limited to 36% in the preferred embodiment. In addition, a surface of the epitaxial structures 130 is higher than a surface of the substrate 102 as shown in FIG. 3.

As mentioned above, to solve the dilemmatic problem, the preferred embodiment provides an undoped cap layer 140 formed on the epitaxial structures 130. It is noteworthy that the undoped cap layer 140 provided by the preferred embodiment is a multilayered cap layer 140 as shown in FIG. 3. The undoped cap layer 140 includes at least a first single layer 140a, a second single layer 140b and a third single layer 140c. As shown in FIG. 3, the first single layer 140a and the third single layer 140c are formed between the second single layer 140b and the epitaxial structure 130, while the third single layer 140c is formed between the first single layer 140a and the second single layer 140b. The undoped cap layer 140 (including the first single layer 140a, the second single layer 140b and the third single layer 140c) includes the first semiconductor material and the second semiconductor material as mentioned above, that is SiGe. According to the preferred embodiment, Ge in the first single layer 140a has a first concentration, Ge in the second single layer 140b has a second concentration, and Ge in the third single layer 140c has a third concentration. The first concentration, the second concentration, and the third concentration are all lower than the Ge concentration in the epitaxial structures 130. According to the preferred embodiment, the first concentration is preferably about 25%, the second concentration is preferably about 0%, and the third concentration is between the first concentration and the second concentration, preferably but not limited to about 10%. In other words, the second preferred embodiment provides a multilayered cap layer 140 has the Ge concentration upwardly decreased. In addition, a thickness of the undoped cap layer 140 is, exemplarily but not limited to, 150 Å in the preferred embodiment. It is also noteworthy that a thickness of the first single layer 140a, a thickness of the second single layer 140b, and a thickness of the third single layer 140c have a ratio, and the ratio is about 1:1:1 according to the preferred embodiment.

As mentioned above, the semiconductor device 100 provided by the preferred embodiment can also include an undoped under layer 150. Since details about the undoped under layer 150 will be described in the following preferred embodiments, therefore those details are omitted herein for simplicity.

According to the semiconductor device 100 having epitaxial structures provided by the third preferred embodiment, the multilayered cap layer 140 is formed on the surface of the epitaxial structures 130. The multilayered cap layer 140 upwardly includes the first single layer 140a, the third single layer 140c, and the second single layer 140b. All of the first single layer 140a, the third single layer 140c, and the second single layer 140b include SiGe. The Ge concentration in the first single layer 140a is preferably about 25%, the Ge concentration in third single layer 140c is preferably about 10%, and the Ge concentration in the second single layer 140b is preferably about 0%. In addition, thickness of the first single layer 140a, the third single layer 140c, and second single layer 140b are substantially identical. That means the multilayered cap layer 140 has the Ge concentration upwardly decreased. Since the first single layer 140a (Ge concentration of about 25%) and the third single layer 140c (Ge concentration of about 10%) are formed between the second single layer 140b (Ge concentration of about 0%) and the epitaxial structure 130 (Ge concentration of about 36%), the first single layer 140a and the third single layer 140c serve as buffer layers between the second single layer 140b and the epitaxial structure 130. Because the two single layers having upwardly decreased concentration are formed between the second single layer 140b and the epitaxial structure 130, the concentration gradient is flatter. Consequently, the cap layer 140 formed on the surface of the epitaxial structures 130 obtains a much smoother surface, and an AFM measured RMS roughness of the cap layer 140 is about 0.65 nm. Compared with the RMS roughness of the pure silicon cap layer, that is 4.21 nm, it is concluded that the surface roughness is much improved. Furthermore, since the Ge concentration of the second single layer 140b in the undoped cap layer 140 is 0%, the second single layer 140b serves as the reacting subject in the silicide process. Thus the agglomeration problem in the silicide process is prevented.

Figure 4:
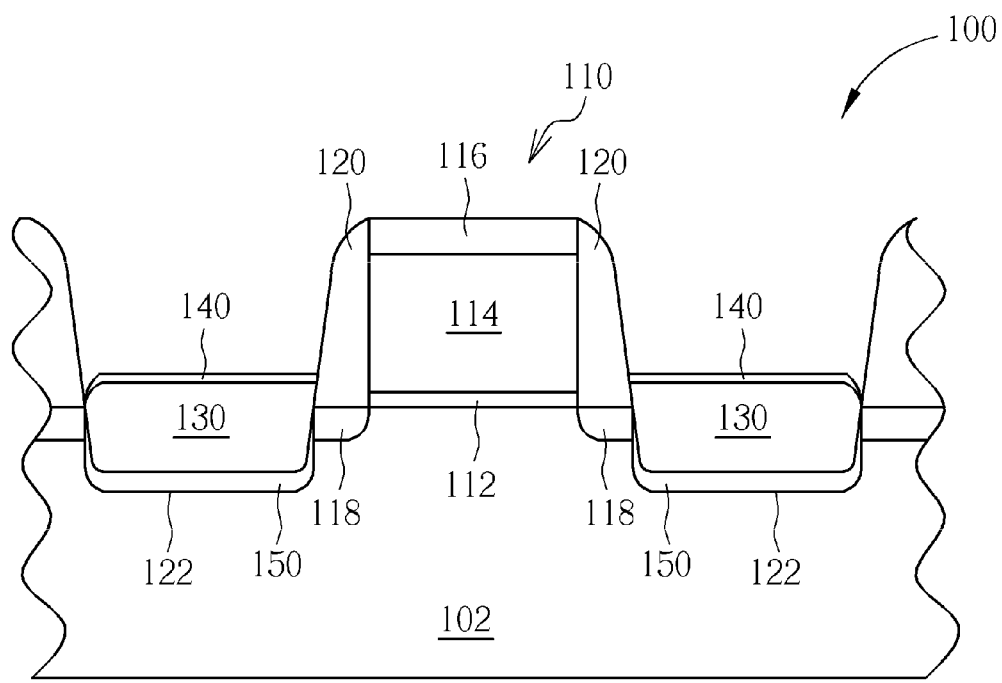
FIG. 4 is a schematic drawing illustrating a semiconductor device having epitaxial structures provided by a fourth preferred embodiment of the present invention.
Figure 5:
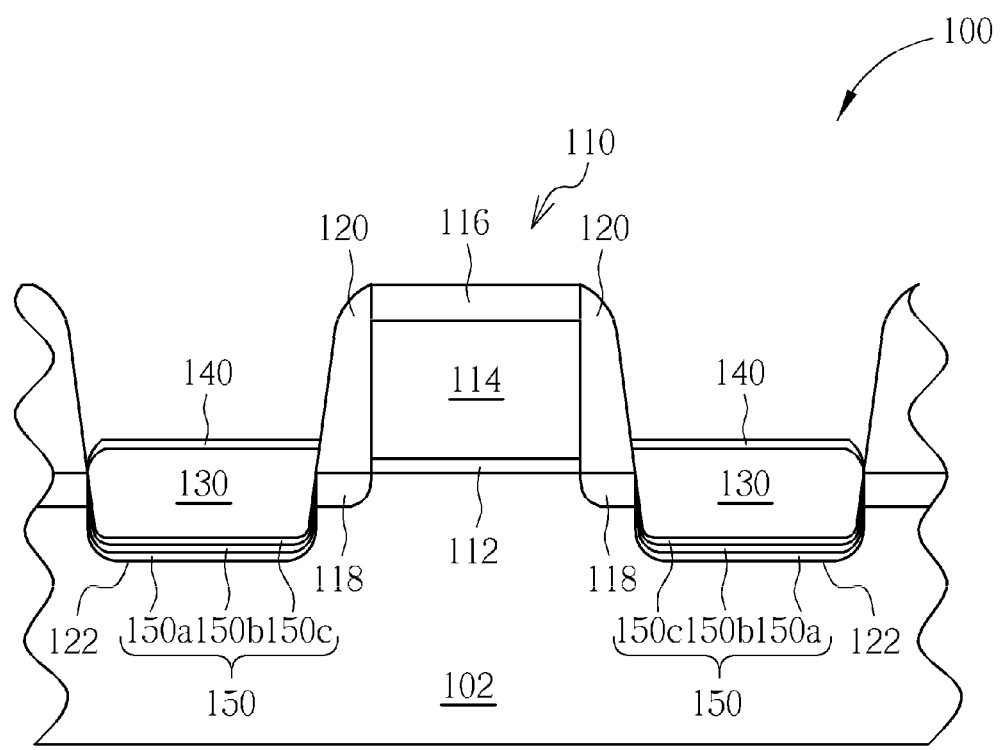
FIG. 5 is a schematic drawing illustrating a semiconductor device having epitaxial structures provided by a fifth preferred embodiment of the present invention.

Please refer to FIGS. 4-5, which are schematic drawings respectively illustrating a semiconductor device having epitaxial structures provided by a fourth and fifth preferred embodiments of the present invention. It is noteworthy that elements the same in the first and fourth and fifth preferred embodiments such as the substrate 102, the gate structure 110, the LDDs 118, the spacer 120, the recesses 122, and the epitaxial structures 130 formed in the recesses 122 are depicted by the same numerals, and those details are omitted herein for simplicity.

As shown in FIG. 4, the fourth preferred embodiment provides an undoped under layer 150 (that is the under layer 150 mentioned in the first, second and third preferred embodiments) formed in the recesses 122. The undoped under layer 150 is formed between the epitaxial structure 130 and the substrate 102 and covers sidewalls and a bottom of the recess 122. As mentioned above, the undoped under layer 150 includes the first semiconductor material and the second semiconductor material. In other words, the undoped under layer 150 includes SiGe. To solve the Vt roll-off problem due to the distinctive difference between the lattice constant of the epitaxial structures 130 and that of the substrate 102, the preferred embodiment provides a single undoped under layer 150, and a Ge concentration of the undoped under layer 150 is lower than the Ge concentration of the epitaxial structures 130, exemplarily is about 25%.

It is noteworthy that because the undoped under layer 150 is provided to solve the problem that the lattice constant of the epitaxial structure 130 is distinctly different from that of the substrate 102, the undoped under layer 150 covering the bottom of the recess 122 cannot be formed so thick that the undoped under layer 150 occupies the space for forming the epitaxial structures 130, and thus reduces the strain stress provided to the channel region. Accordingly, a thickness of the undoped under layer 150 covering the sidewalls of the recess 122 and the thickness of the undoped under layer 150 covering the bottom of the recess 122 have a ratio and the ratio is about 1:1 in the preferred embodiment. It is found that when the undoped under layer 150 having Ge concentration of about 25% is formed in a process pressure of about 50 Torr, a ratio of the thickness of the single under layer 150 covering the sidewalls of the recess 122 and the thickness of the single under layer 150 covering the bottom of the recess 122 is about 1:2. Consequently, the space for forming the epitaxial structure 130 is reduced. Therefore the preferred embodiment forms the single under layer 150 in a process pressure of about 10 Torr. Accordingly, the thickness of the single under layer 150 covering the sidewalls of the recess 122 and the thickness of the single under layer 150 covering the bottom of the recess 122 approaches the expected ratio: 1:1.

According to the semiconductor device 100 having epitaxial structures provided by the fourth preferred embodiment, the single under layer 150 is formed in between the epitaxial structure 130 and the substrate 102. The single under layer 150 includes SiGe and the Ge concentration in the single under layer 150 is preferably about 25%. Since the single under layer 150 (Ge concentration of about 25%) is form between the substrate 102 (Ge concentration of about 0%) and the epitaxial structure 130 (Ge concentration of about 36%), the single under layer 150 serves as a buffer layer between the substrate 102 and the epitaxial structure 130. And thus the Vt roll-off problem caused by the distinctive difference between the lattice constant of the epitaxial structures 130 and that of the substrate 102 is mitigated. Moreover, since the ratio of the thickness of the single under layer 150 covering the sidewalls of the recess 122 and the thickness of the single under layer 150 covering the bottom of the recess 122 is about 1:1, the single under layer 150 is formed not to occupy the precious space used to form the epitaxial structure 130. Briefly speaking, the single under layer 150 provided by the preferred embodiment is able to solve the Vt roll-off problem without rendering impact to the strain stress.

Please refer to FIG. 5, which is a schematic drawing illustrating a semiconductor device having epitaxial structures provided by a fifth preferred embodiment of the present invention. As shown in FIG. 5, the fifth preferred embodiment provides an undoped under layer 150 (that is the undoped under layer 150 mentioned in the first, second and third preferred embodiments) formed in the recesses 122. The undoped under layer 150 is formed between the epitaxial structure 130 and the substrate 102 and covers sidewalls and a bottom of the recess 122. As mentioned above, the undoped under layer 150 includes the first semiconductor material and the second semiconductor material. In other words, the undoped under layer 150 includes SiGe. It is noteworthy that the undoped under layer 150 provided by the preferred embodiment is a multilayered under layer upwardly including a first single layer 150a, a second single layer 150b, and a third single layer 150c. Ge in the first single layer 150a has a first concentration, Ge in second single layer 150b has a second concentration, and Ge in the third single layer 150c has a third concentration. The first concentration, the second concentration, and the third concentration are all lower than the Ge concentration of the epitaxial structures 130. The third concentration is larger than the second concentration and the second concentration is larger than the first concentration. For example, the first concentration is about 10%, the second concentration is about 17%, and the third concentration is about 25%. In other words, the Ge concentration of the multilayered under layer 150 provided by the preferred embodiment is upwardly increased. In addition, a thickness of the first single layer 150a, a thickness of the second single layer 150b, and a thickness of the third single layer 150c have a ratio, and the ratio is between 1:1:1 and 1:1:2. It is noteworthy that with increase of the Ge concentration in the first single layer 150a, the second single layer 150b, and the third single layer 150c, the ratio of the thickness of the multilayered under layer 150 covering the sidewalls of the recess 122 and the thickness of the multilayered under layer 150 covering the bottom of the recess 122 is getting near to 1:1.

According to the semiconductor device 100 having epitaxial structures provided by the fifth preferred embodiment, the multilayered under layer 150 is formed in between the epitaxial structure 130 and the substrate 102. The multilayered under layer 150 includes the first single layer 150a, the second single layer 150b, and the third single layer 150c. The first single layer 150a, the second single layer 150b and the third single layer 150c all include SiGe. The Ge concentrations in the first single layer 150a, in the second single layer 150b and in the third single layer 150c is increased from 10%, to 17%, and to 25%. Therefore the multilayered under layer 150 serves as a buffer layer between the substrate 102 (having the Ge concentration of 0%) and the epitaxial structure 130 (having the Ge concentration of 36%). Because the three single layers having upwardly increased Ge concentration are formed between the substrate 102 and the epitaxial structure 130, the concentration gradient is flatter. Consequently, the Vt roll-off problem caused by the distinctive difference between the lattice constant of the epitaxial structures 130 and that of the substrate 102 140b is mitigated. Moreover, since the ratio of the thickness of the multilayered under layer 150 covering the sidewalls of the recess 122 and the thickness of the multilayered under layer 150 covering the bottom of the recess 122 is about 1:1, the multilayered under layer 150 is formed not to occupy the precious space used to form the epitaxial structures 130. Briefly speaking, the multilayered under layer 150 provided by the preferred embodiment is able to solve the Vt roll-off problem without rendering impact to the strain stress.

It should be noted that the undoped under layer 150 provided by the fourth and fifth preferred embodiments of the present invention and the undoped cap layer 140 provided by the first, second, and third preferred embodiments can be formed in different combination in order to improve the semiconductor device 100 having the epitaxial structures 130.

According to the semiconductor device having epitaxial structures provided by the present invention, the epitaxial structures serving as the source/drain of the semiconductor device includes the undoped cap layer with lower Ge concentration formed on the surface of the epitaxial structures, therefore the agglomeration between the metals and Ge in the silicide process and the junction leakage are both prevented. Furthermore, the semiconductor device having epitaxial structures provided by the present invention also includes the undoped under layer with lower Ge concentration formed in the recess and in between the epitaxial structure and the substrate, therefore the Vt roll-off issue, which is caused by lattice constant difference between the SiGe epitaxial structure and the silicon substrate, is mitigated.

Those skilled in the art will readily observe that numerous modifications and alterations of the device and method may be made while retaining the teachings of the invention.

What is claimed is:

1. A semiconductor device having epitaxial structures comprising:
   a gate structure positioned on a substrate;
   epitaxial structures formed in the substrate at two sides of the gate structure, the epitaxial structures comprising a dopant, a first semiconductor material having a first lattice constant, and a second semiconductor material having a second lattice constant, the second lattice constant being larger than the first lattice constant, the second semiconductor material in the epitaxial structures having a first concentration; and
   an undoped cap layer formed on the epitaxial structures, the undoped cap layer being a multi-layer and comprising the first semiconductor material and the second semiconductor material, the second semiconductor material in the undoped cap layer having a second concentration, and the second concentration is lower than the first concentration, the second concentration is at least 25%.

2. The semiconductor device having epitaxial structures according to claim 1, further comprising:
   lightly-doped drains (LDDs) formed in the substrate respectively at the two sides of the gate structure; and
   a spacer formed on sidewalls of the gate structure.

3. The semiconductor device having epitaxial structures according to claim 1, wherein the first semiconductor material comprises silicon (Si) and the second semiconductor material comprises germanium (Ge).

4. The semiconductor device having epitaxial structures according to claim 1, wherein the multi-layer comprises at least a first single layer and a second single layer, the first single layer is formed between the second single layer and the epitaxial structure, the first single layer has the second concentration, the second semiconductor material in the second single layer has a third concentration, and the third concentration is equal to 0%.

5. The semiconductor device having epitaxial structures according to claim 4, wherein a thickness of the first single layer and a thickness of the second single layer have a ratio, and the ratio is about 1:2.

6. The semiconductor device having epitaxial structures according to claim 4, wherein the multi-layer further comprises a third single layer formed between the first single layer and the second single layer, the second semiconductor material in the third single layer has a fourth concentration, and the fourth concentration is between the second concentration and the third concentration.

7. The semiconductor device having epitaxial structures according to claim 6, wherein the fourth concentration is about 10%.

8. The semiconductor device having epitaxial structures according to claim 6, wherein a thickness of the first single layer, a thickness of the second single layer, and a thickness of the third single layer have a ratio, and the ratio is about 1:1:1.

9. The semiconductor device having epitaxial structures according to claim 1, further comprising a multilayered under layer positioned between the epitaxial structure and the substrate, the multilayered under layer comprises the first semiconductor material and the second semiconductor material.

10. The semiconductor device having epitaxial structures according to claim 9, wherein the second semiconductor material in the multilayered under layer is between 10% and 25%.

11. The semiconductor device having epitaxial structures according to claim 10, wherein a concentration of the second semiconductor material in the multilayered under layer is upwardly increased.

12. A semiconductor device having epitaxial structures comprising:
a gate structure positioned on a substrate;
a pair of recesses formed in the substrate at two sides of the gate structure;
epitaxial structures respectively formed in recesses at the two sides of the gate structure, the epitaxial structures comprising a dopant, a first semiconductor material having a first lattice constant, and a second semiconductor material having a second lattice constant, the second lattice constant being larger than the first lattice constant, the second semiconductor material in the epitaxial structures having a first concentration; and
an undoped under layer formed in the recesses and in between the epitaxial structure and the substrate, the undoped under layer being a multi-layer and covering sidewalls and a bottom of the recess and having the first semiconductor material and the second semiconductor material, the second semiconductor material in the undoped under layer having a second concentration, and the second concentration is lower than the first concentration, the second concentration is about 25%,
wherein a thickness of the undoped under layer covering the sidewalls of the recess and a thickness of the undoped under layer covering the bottom of the recess have a ratio, and the ratio is about 1:1 and
a multilayered cap layer positioned on epitaxial structures, the multilayered cap layer comprises the first semiconductor material and the second semiconductor material, wherein the second semiconductor material in the multilayered cap layer has a concentration of at least 25%.

13. The semiconductor device having epitaxial structures according to claim 12, further comprising:
lightly-doped drains formed in the substrate respectively at the two sides of the gate structure; and
a spacer formed on sidewalls of the gate structure.

14. The semiconductor device having epitaxial structures according to claim 12, wherein the first semiconductor material comprises Si and the second semiconductor material comprises Ge.

15. The semiconductor device having epitaxial structures according to claim 12, wherein the multilayered under layer comprises at least a first single layer, a second single layer, and a third single layer upwardly formed on the sidewalls and the bottom of the recess.

16. The semiconductor device having epitaxial structures according to claim 15, wherein the third single layer has the second concentration, the second single layer has a third concentration, and the first single layer has a fourth concentration, the second concentration is larger than the third concentration and the third concentration is larger than the fourth concentration.

17. The semiconductor device having epitaxial structures according to claim 16, wherein the third concentration is about 17% and the fourth concentration is about 10%.

18. The semiconductor device having epitaxial structures according to claim 16, wherein a thickness of the first single layer, a thickness of the second single layer and a thickness of the third single layer have a ratio and the ratio is between 1:1:1 and 1:1:2.

19. The semiconductor device having epitaxial structures according to claim 12, wherein the concentration of the second semiconductor material in the multilayered cap layer is upwardly decreased.

* * * * *